United States Patent [19]

Asano

[11] Patent Number: 5,315,484

[45] Date of Patent: May 24, 1994

[54] PRINTED CIRCUIT BOARD AND METHOD FOR ATTACHING MOVABLE SWITCH THERETO

[75] Inventor: Seiji Asano, Saitama, Japan

[73] Assignee: Fuji Photo Film Co., Ltd., Kanagawa, Japan

[21] Appl. No.: 972,922

[22] Filed: Nov. 6, 1992

[30] Foreign Application Priority Data

Nov. 6, 1991 [JP] Japan ................. 3-290248

[51] Int. Cl.⁵ .............................. H05K 1/16
[52] U.S. Cl. ........................ 361/765; 361/736; 361/772; 361/777; 174/261; 439/55
[58] Field of Search ............... 361/736, 748, 760, 765, 361/772, 774, 778, 777, 779, 785, 750, 751, 803; 174/52.4, 256, 261; 439/55, 64, 44; 200/292; 354/288, 485

[56] References Cited

U.S. PATENT DOCUMENTS 3,015,718 12/1958 Petri ..................... 240/8.16
4,771,303 9/1988 Matsumoto et al. ........... 354/195.12
4,990,724 2/1991 Suppelsa et al. ................ 174/261

*Primary Examiner*—Leo P. Picard
*Assistant Examiner*—Young Whang
*Attorney, Agent, or Firm*—Young & Thompson

[57] ABSTRACT

A printed circuit board is provided with two soldering land portions on respective lead lines. Each of the soldering land portions has two sub-soldering land portions and a narrow connecting portion for connecting the sub-soldering portions, so that the land portions are substantially H-shaped. When the printed circuit board is dip soldered after being coated with a solder-proof layer exposing the soldering land portions, solder sticks to the soldering land portions in such a way that it is thicker on the sub-soldering land portions but thinner on the narrow connecting portions. Thereafter, the synchro contacts of a camera flash unit are positioned on the respective narrow connecting portions and soldered to the lead lines by a soldering iron or hot air.

17 Claims, 8 Drawing Sheets

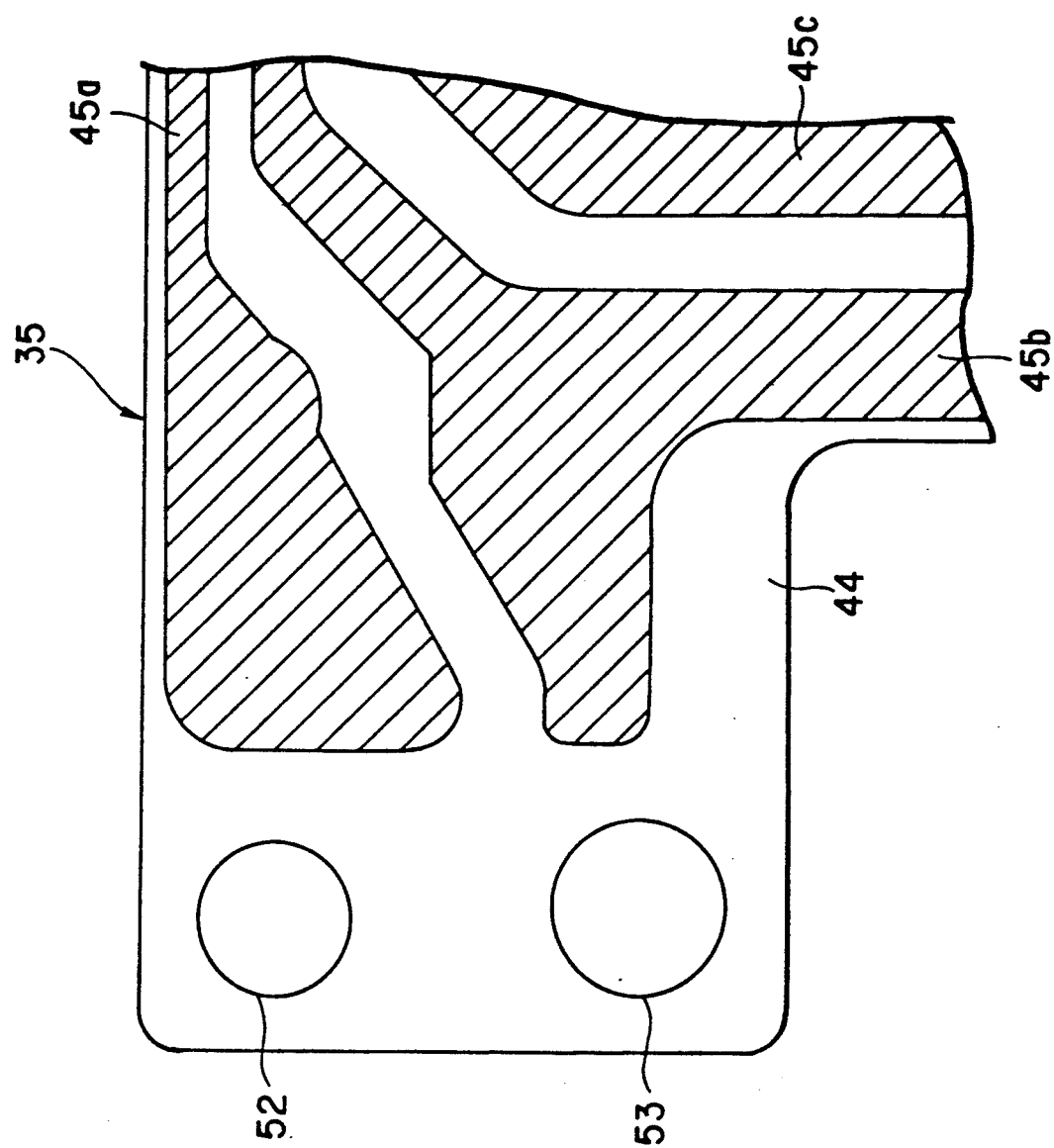

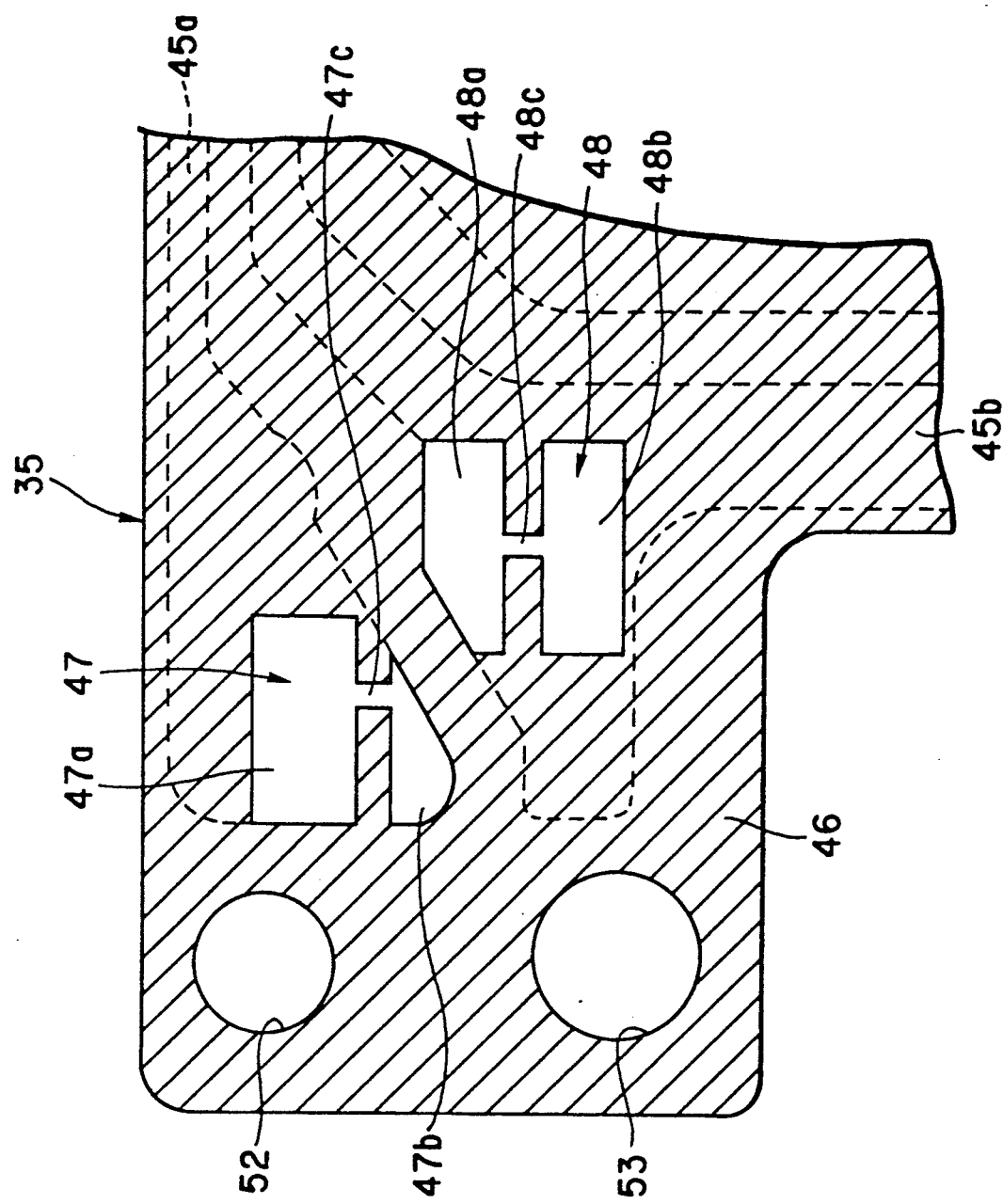

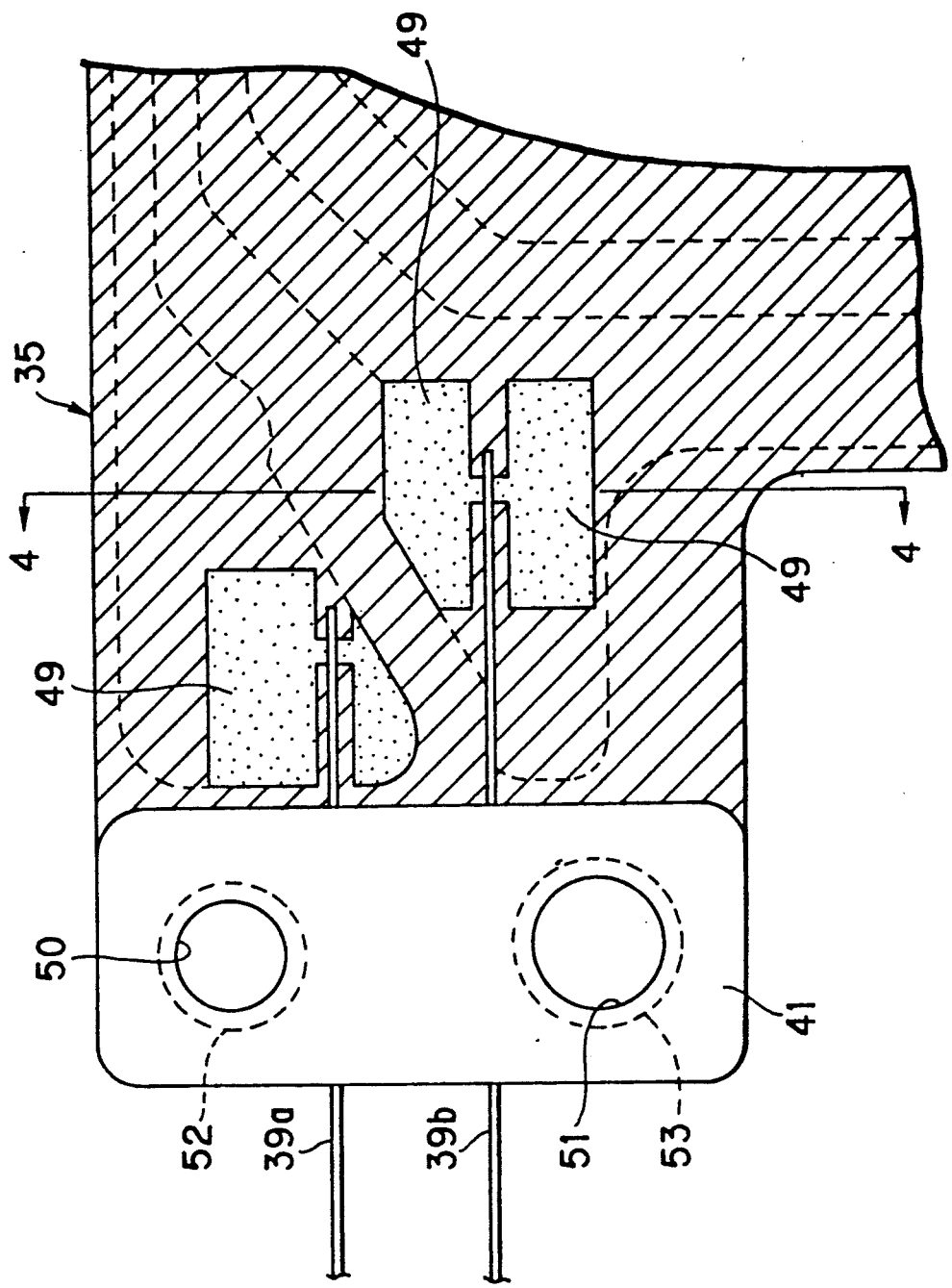

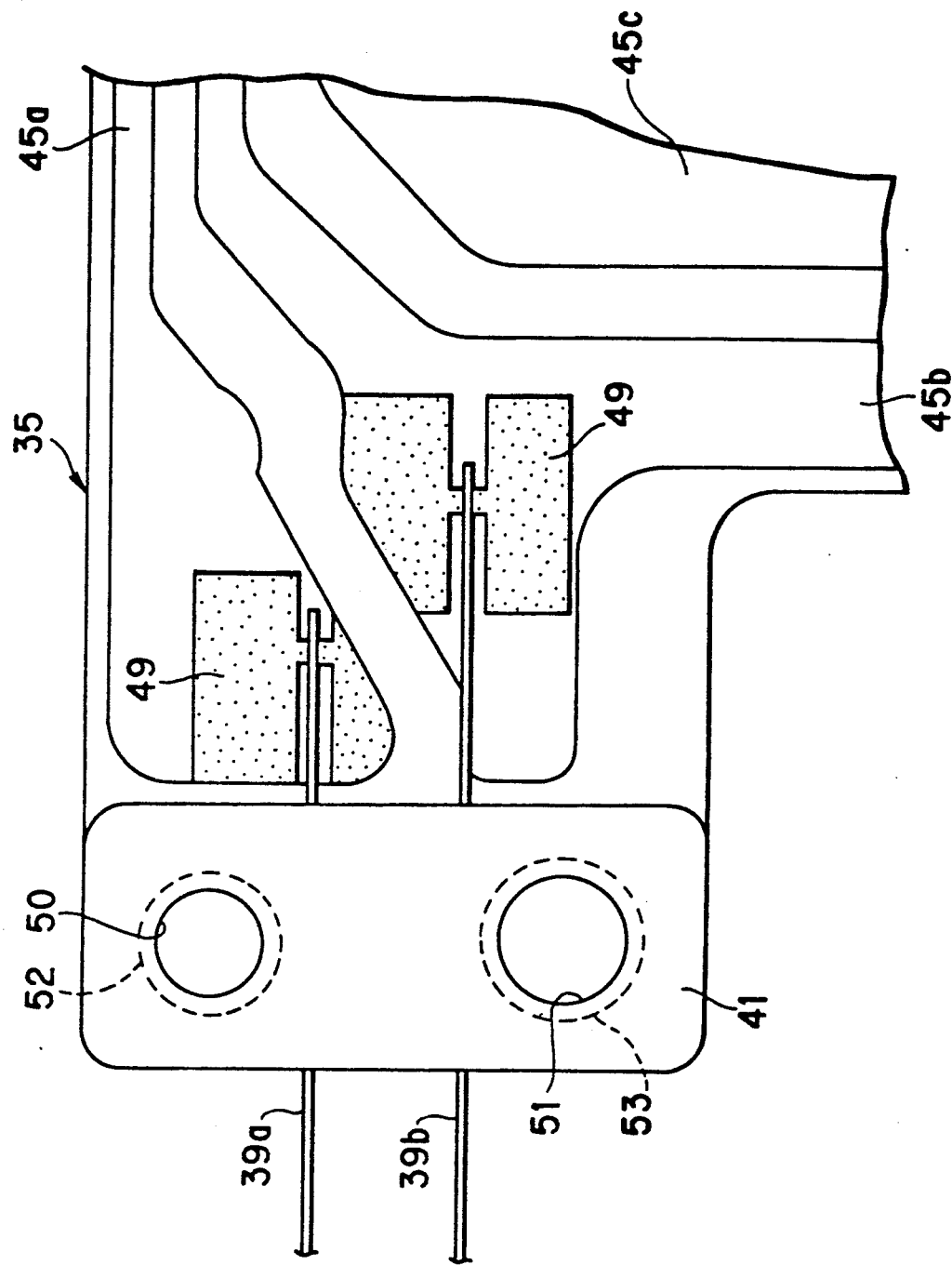

PRINTED CIRCUIT BOARD AND METHOD FOR ATTACHING MOVABLE SWITCH THERETO

BACKGROUND OF THE INVENTION

1. Field of the Invention

The present invention relates to a printed circuit board, e.g. for use in a camera, and a method for attaching a movable switch to the printed circuit board by the use of an improved soldering pattern.

2. Prior Art

A lens-fitted photographic film unit preloaded with a photographic film has a printed circuit board. The printed circuit board has electrical elements such as a synchro switch consisting of movable synchro contacts, a capacitor, a resistance and the like which are attached thereto such that all are soldered to lead lines formed on the printed circuit board. More particularly, the capacitor, the resistance and the like are attached to the lead lines by means of dip soldering. In this dip soldering, melted solder in a vessel also sticks to soldering land portions of the lead lines where the synchro contacts are to be soldered. Thereafter, a holder for holding the synchro contacts is attached to the printed circuit board such that each end of the synchro contacts is positioned on a respective end of the soldering land portions. Then the synchro contacts are soldered with a soldering iron.

When an exposure opening of the film unit is fully opened, the synchro contacts must be brought reliably into contact with each other by contact with a portion of a shutter blade in order to emit a flash of light for flash photography. Therefore, it is necessary to position the synchro contacts relative to the shutter blade with precision.

However, as the solder sticks to the soldering land portions in a swollen condition during the above-mentioned dip soldering, it is difficult to position the synchro contacts in contact with the middle portions of the soldering land portions, which are the only precise positions for the synchro contacts. Furthermore, there is a danger that the synchro contacts may be soldered obliquely with respect to the printed circuit board, which prevents accurate positioning of the synchro contacts relative to the shutter blade.

OBJECTS OF THE INVENTION

It is an object of the present invention to provide a printed circuit board and a method for attaching switch contacts to a printed circuit board in which the switch contacts can be attached easily.

It is another object of the present invention to provide a printed circuit board and a method for attaching switch contacts to a printed circuit board in which the switch contacts can be positioned at exactly predetermined positions with high precision.

SUMMARY OF THE INVENTION

In order to achieve the above and other objects of the present invention, a printed circuit board is provided with two soldering land portions each of which consists of two sub-soldering land portions and a narrow connecting portion and is approximately in the shape of a letter H. Switch contacts are disposed respectively on the narrow connecting portions where the solder sticks less and so does not lead to swelling as a result of an automatic soldering process such as e.g., dip soldering.

In the method of the present invention, two soldering land portions each of which consists of two sub-soldering land portions and a narrow connecting portion are formed by applying a solder-proof layer to a printed circuit board. The printed circuit board is subjected to dip soldering to cause solder to stick only to the sub-soldering land portions and the narrow connecting portions. Thereafter, a holder with switch contacts is attached to the printed circuit board such that each end of the switch contacts is positioned on one of the respective narrow connecting portions. Then, the switch contacts are soldered by use of a soldering iron or hot air which melts the solder on the sub-soldering land portions and the narrow connecting portions.

According to the present invention, the solder applied by the dip soldering is flattened, so that the heights of the solder on the sub-soldering land portions are low as compared with solders applied to conventional soldering land portions. Therefore, the switch contacts can be positioned on the flattened solders on the narrow connecting portions, which can enhance high accuracy of positioning of the switch contacts.

BRIEF DESCRIPTION OF THE DRAWINGS

The above and other objects and advantages of this invention will become apparent to persons skilled in the art from the following detailed description of the invention when read in connection with the accompanying drawings, in which:

FIG. 3A is a fragment of the printed circuit board of the invention in which lead lines are formed on a base board;

FIG. 3B is the same fragment of the printed circuit board as in FIG. 3A, in which a solder-proof layer is applied to a surface of the base board except on areas defining soldering land portions;

FIG. 3C is the same fragment of the printed circuit board of FIGS. 3A and 3B, to which a holder with synchro contacts has been attached after solder was applied to the soldering land portions by dip soldering;

FIG. 3D is the same fragment of the printed circuit board of FIGS. 3A–3C, from which the solder-proof layer has been removed;

DETAILED DESCRIPTION OF THE PREFERRED EMBODIMENT

Figure 1:
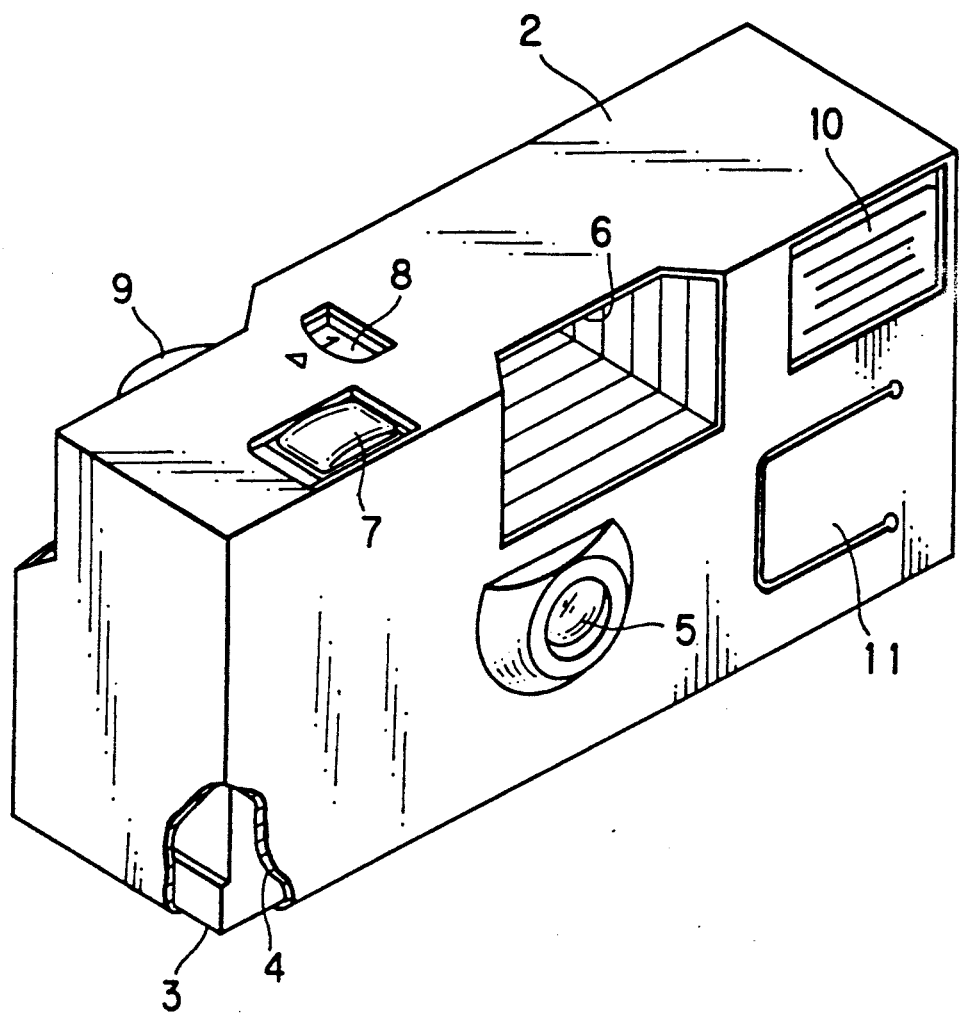
FIG. 1 is a perspective view of a lens-fitted photographic film unit adapted to use a printed circuit board according to the present invention.

In FIG. 1, a lens-fitted photographic film unit 2 (hereinafter referred to simply as a film unit) consists of a film housing 3 and an outer casing 4. The film housing 3 has a photograph taking function by means of a taking lens 5, a viewfinder 6, a shutter release button 7, a film frame counter 8, a film advancing wheel 9, a flash window 10 and a flash switch 11. The outer casing 4 has illustrations and information printed thereon for ornamental and informative purposes and covers the film housing 3.

Figure 2:
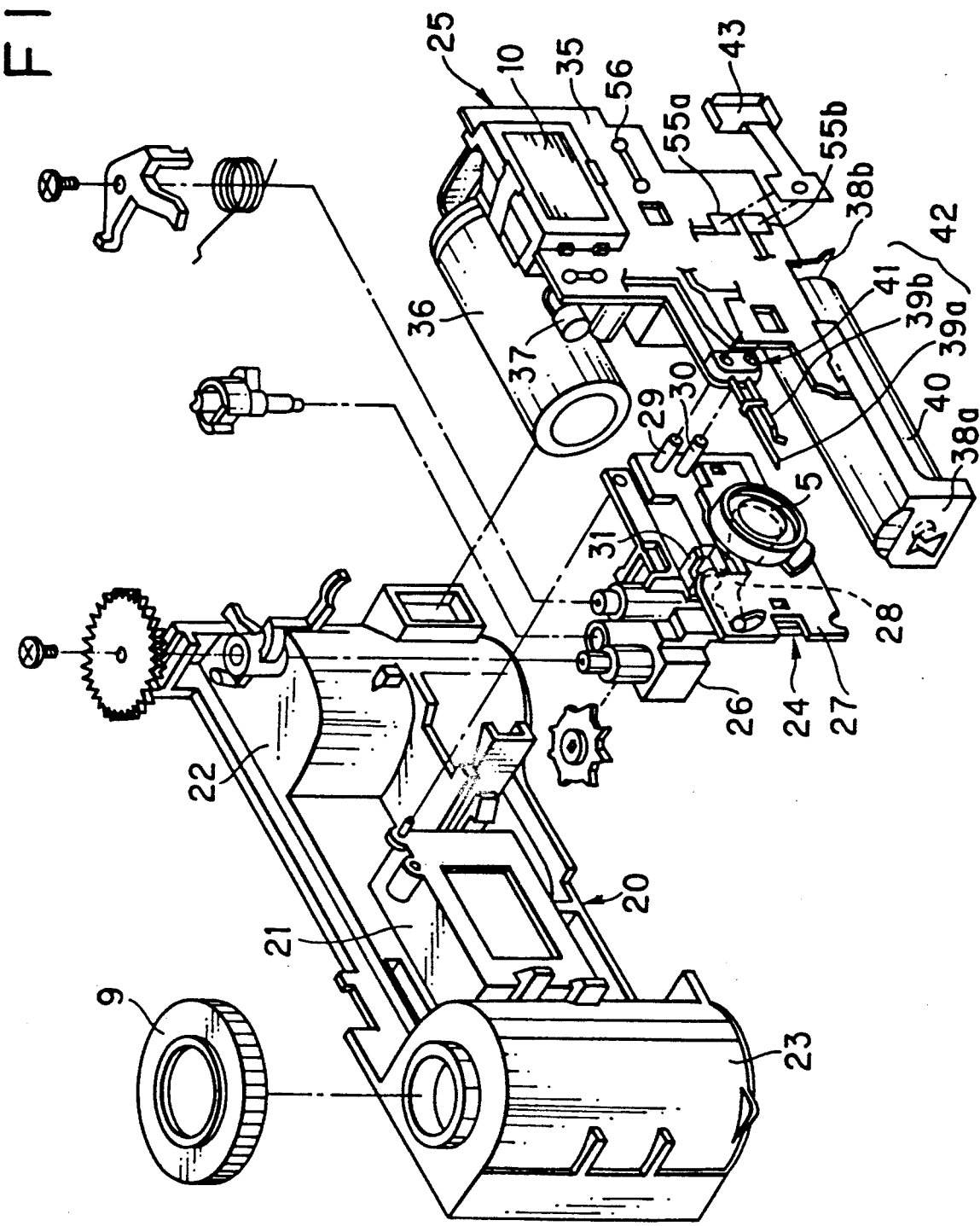
FIG. 2 is an exploded perspective view of the film unit of FIG. 1.

In FIG. 2, the film housing 3 is constructed of a main body 20 and front and rear covers (not shown) which are detachably attached to the main body 20. A photographic film with one end attached to a cassette from which the film has been drawn and wound in a roll, is preloaded in the film housing 3 in a light-tight manner.

The main body 20 is constituted by an exposure chamber 21 at its center and a film supply chamber 22 and a film take-up chamber 23 on opposite sides thereof. A shutter unit 24 and a flash device 25 are attached to the front of the main body 20 by means of claws.

Shutter unit 24 has a base member 26 with an exposure opening, a shutter cover 27 and a shutter blade 28 which is disposed so as to be swingable between the base member 26 and the shutter cover 27 for opening and closing the exposure opening. The taking lens 5 is fitted in a recess formed on the front of the shutter cover 27. A pair of pins 29 and 30 are formed integrally with the base member 26. The shutter blade 28 is provided with a pressing portion 31 for pressing a synchro contact 39a.

The flash device 25 has the flash window 10 and a printed circuit board 35 to which a capacitor 36, a resistance 37, electrode terminals 38a, 38b and the synchro contacts 39a, 39b are attached. A battery 40 is disposed between the electrode terminals 38a, 38b to supply power to the electrical elements. The synchro contacts 39a, 39b are held by a holder 41. The synchro contacts 39a, 39b and the holder 41 constitute a synchro switch 42 which makes the flash window 10 emit a flash of light, when the synchro contact 39a is pressed by the pressing portion 31 into contact with the synchro contact 39a. A movable switching segment 43 is adapted to be pressed by the flash switch 11 in order to connect stationary contact segments 55a, 55b electrically.

In FIG. 3A, it will be seen that the printed circuit board 35 has a plastic base board 44 which is an insulator, and electrically-conductive lead lines 45a, 45b, 45c ... as indicated by hatched portions. The printed circuit board 35 is provided at one end with holes 52 and 53 through which extend the pins 29 and 30 for positioning the switch 42.

A solder-proof layer 46, indicated by hatched portions in FIG. 3B, is applied to a surface of the printed circuit board 35 so as to leave exposed soldering land portions 47, 48 on the lead lines 45a, 45b. The solder-proof layer 46 serves to prevent solder from sticking to undesired portions of the lead lines 45a, 45b, 45c ... during dip soldering.

The soldering land portion 48 has a pair of sub-soldering land portions 48a, 48b and a narrow connecting portion 48c for connecting the sub-soldering land portions 48a, 48b. The sub-soldering land portions 48a, 48b have rectangular shapes or approximately rectangular shapes, so that the soldering land portion 48 is approximately in the shape of a letter H.

Figure 4:
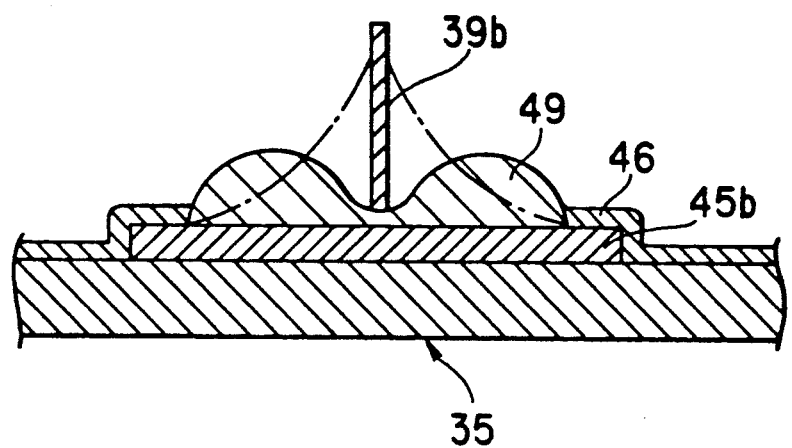
FIG. 4 is a cross section taken along line 4—4 of FIG. 3C.

When melted solder 49, indicated by dots in FIGS. 3C and 3D, sticks to the soldering land portion 48 as a result of dip soldering, the cross-sectional contour of land portion 48 is raised over the sub-soldering land portions 48a, 48b and relatively lower over the narrow connecting portions 48c, as illustrated in FIG. 4. The soldering land portion 47 has approximately the same shape as the soldering land portion 48, and acquires substantially the same cross section upon dip soldering.

The sub-soldering land portions have approximately rectangular shapes in this embodiment, but may have square, polygonal, circular, elliptical shapes or the like.

Figure 5:
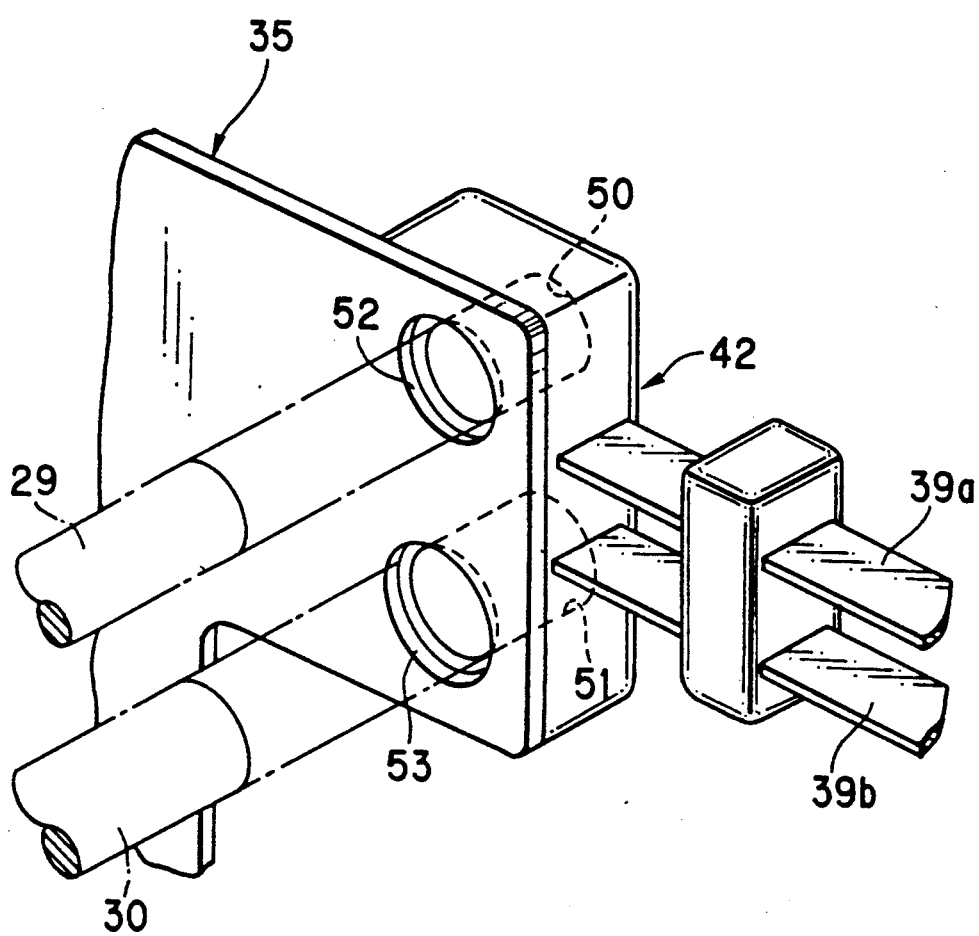
FIG. 5 is a fragmentary perspective view of the same fragment of the finished printed circuit board of FIG. 3D, illustrating the condition wherein pins of a shutter unit are inserted in holes in the holder via holes in the base board.

As illustrated in FIG. 3C, the switch 42 is secured to an end of the printed circuit board 35 immediately before soldering the synchro contacts 39a and 39b. The holder 41 has holes 50 and 51. When positioning the switch 42 on the shutter unit 24, the pins 29 and 30 are inserted in the holes 50 and 51, as illustrated in FIG. 5. At this time, the insertion of the pins 29 and 30 will not be hindered by the printed circuit board 35, since the holes 52 and 53 of the printed circuit board 35 are formed slightly larger than the holes 50 and 51. Furthermore, the diameter of the hole 50 is different from that of the hole 51 and thus they are easily distinguishable so that the switch 42 cannot be attached backward to the shutter unit 24.

The assembly of the printed circuit board 35 and its attachments as described above will now be described. First, the lead lines 45a, 45b, 45c ... are formed on the base board 44 by a photo-etching process to make the printed circuit board 35, as illustrated in FIG. 3A. Then, the solder-proof layer 46 is provided on the printed circuit board 35 in order to define the soldering land portions 47 and 48, as illustrated in FIG. 3B.

Electrical elements such as the capacitor 36, the resistance 37, the electrode terminals 38a, 38b and the like are attached to the printed circuit board 35. Next, the electrical elements are soldered to the lead lines 45a, 45b, 45c ... with solder by a dip soldering machine. During this dip soldering process, the solder 49 sticks also to the soldering land portions 47 and 48, as illustrated in FIG. 4.

After the dip soldering, the holder 41 of the switch 42 is mounted on the printed circuit board 35 by an adhesive, as illustrated in FIG. 3C. At this time, the synchro contacts 39a and 39b are respectively brought into contact with the narrow connecting portions 47b and 48b where the solder 49 is not greatly thickened but is comparatively flattened, so that the bottom surface of the holder 41 will not come loose from the printed circuit board 35. As a result, the switch 42 can be positioned accurately on the printed circuit board 35.

After the switch 42 is mounted on the printed circuit board 35, the solder 49 on the soldering land portions 47 and 48 is melted by a soldering iron or hot air so as to solder the synchro contacts 39a and 39b. Thereafter, the melted solder 49 solidifies in that shape indicated by a one-dot-dash line in FIG. 4, enabling sure connection between the synchro contacts 39a, 39b and the lead lines 45a, 45b. As illustrated in FIG. 3D, after soldering, the solder-proof layer 46 is removed from the surface of the printed circuit board 35 so as to expose the contact segments 55a, 55b. Thereafter, it is preferable to coat the lead lines 45a, 45b, 45c ... but not the contact segments 55a, 55b, with an insulating material.

The printed circuit board 35 with the switch 42 is positioned on the shutter unit 24 by inserting the pins 29 and 30 into the holes 50 and 51, and the switch 42 can operate accurately and reliably thereafter.

The present invention is adaptable to other printed circuit boards when attaching switches by soldering processes. Furthermore, the present invention may be used in automatic soldering processes such as a flow soldering process.

Various other changes and modifications will be apparent to those having skill in this field. Therefore, unless otherwise these changes and modifications depart from the scope of the present invention, as defined by the appended claims, they should be construed as being included therein.

What is claimed is:

1. A method for attaching a pair of switch contacts to a printed circuit board having at least two lead lines, comprising the steps of:
   providing a soldering land portion on each of said lead lines by coating a surface of said lead lines with a solder-proof layer while leaving uncoated said soldering land portions, each of said soldering land portions having two sub-soldering land portions and a narrow connecting portion interconnecting middle portions of said sub-soldering land portions;
   coating each of said soldering land portions with solder;
   attaching a holder with said switch contacts to said printed circuit board such that one end of each of said switch contacts is positioned on a respective one of said narrow connecting portions; and
   soldering said switch contacts to said lead lines by melting the solder on said soldering land portions.

2. The method as recited in claim 1, wherein each of said soldering land portions is substantially H-shaped.

3. The method as recited in claim 1, wherein said solder is applied by means of dip soldering by dipping said printed circuit board into melted solder.

4. The method as recited in claim 1, wherein said switch contacts are synchro contacts which are closed by pressure from a portion of a camera shutter blade so as to emit a flash of light.

5. The method as recited in claim 1, further comprising the step of thereafter removing said solder-proof layer.

6. The method as recited in claim 1, wherein said holder has a first hole and a second hole slightly larger than said first hole in which respectively two pins formed on a camera shutter unit are disposed so as to position said holder in assembly with said shutter unit.

7. The method as recited in claim 6, wherein said base plate has a first opening and a second opening slightly larger than said first opening respectively correspondingly to said first and second holes, said first and second openings being slightly larger than said respective first and second holes so as to prevent said base plate from interfering with advance of said pins.

8. The method as recited in claim 1, wherein said holder is attached to said printed circuit board by an adhesive.

9. A printed circuit board having at least two lead lines thereon and a holder with a pair of switch contacts secured to said board, comprising:
   a soldering land portion provided on each of said lead lines to solder said switch contacts to respective ones of said lead lines, each of said soldering land portions having two sub-soldering land portions and a narrow connecting portion interconnecting middle portions of said sub-soldering land portions, said narrow connecting portions being in electrical contact with respective ones of said switch contacts.

10. The printed circuit board as recited in claim 9, wherein each of said soldering land portions is substantially H-shaped.

11. The printed circuit board as recited in claim 9, wherein solder has been applied to said soldering land portions by dip soldering.

12. The printed circuit board as recited in claim 11, wherein one end of each of said switch contacts is positioned over a respective one of said narrow connecting portions after said dip soldering and said switch contacts are soldered to respective ones of said leads by melting said solder.

13. A printed circuit board having at least two lead lines thereon and a soldering land portion provided on each of said lead lines, each of said soldering land portions having two sub-soldering land portions and a narrow connecting portion interconnecting middle portions of said sub-soldering land portions.

14. The printed circuit board as recited in claim 13, wherein each of said soldering land portions is substantially H-shaped.

15. The printed circuit board as recited in claim 13, wherein solder has been applied to said soldering land portions by dip soldering.

16. The printed circuit board as recited in claim 15, wherein the solder on said sub-soldering land portions is thicker than the solder on said narrow connecting portion.

17. The printed circuit board as recited in claim 13, wherein said soldering land portions are coated with solder and the solder on said sub-soldering land portions is thicker than the solder on said narrow connecting portion.

* * * * *